US009255839B2

(12) United States Patent  (10) Patent No.: US 9,255,839 B2
Möttönen et al.  (45) Date of Patent: Feb. 9, 2016

(54) DETECTOR OF SINGLE MICROWAVE PHOTONS PROPAGATING IN A GUIDE

(75) Inventors: Mikko Möttönen, Helsinki (FI); Jukka Pekola, Helsinki (FI)

(73) Assignee: AALTO-KORKEAKOULUSAATIO, Espoo (FI)

( * ) Notice: Subject to any disclaimer, the term of this patent is extended or adjusted under 35 U.S.C. 154(b) by 384 days.

(21) Appl. No.: 13/823,822

(22) PCT Filed: Sep. 20, 2011

(86) PCT No.: PCT/FI2011/050805
§ 371 (c)(1),
(2), (4) Date: Jul. 10, 2013

(87) PCT Pub. No.: WO2012/038596
PCT Pub. Date: Mar. 29, 2012

(65) Prior Publication Data
US 2013/0281302 A1  Oct. 24, 2013

(30) Foreign Application Priority Data
Sep. 20, 2010  (FI) .................................... 20105965

(51) Int. Cl.
*G01J 1/44*  (2006.01)
*B82Y 10/00*  (2011.01)
(Continued)

(52) U.S. Cl.
CPC . *G01J 1/44* (2013.01); *B82Y 10/00* (2013.01); *G01J 1/42* (2013.01); *G06N 99/002* (2013.01); *H01L 39/22* (2013.01); *B82Y 15/00* (2013.01); *G01J 5/20* (2013.01)

(58) Field of Classification Search
CPC .......... G01J 1/44; B82Y 10/00; G06N 99/002
USPC .................... 324/637; 333/99 S; 505/210
See application file for complete search history.

(56) References Cited

U.S. PATENT DOCUMENTS 4,935,626 A * 6/1990 Schneider .................. 250/336.2
4,956,307 A   9/1990 Pollack et al. ................. 437/40
(Continued)

FOREIGN PATENT DOCUMENTS

JP   02-187069 A   7/1990
WO  WO 2009/101257 A1  8/2009
WO  WO 2010/043742 A1  4/2010

OTHER PUBLICATIONS

G. Romero et al., "Photodetection of propagating quantum microwaves in circuit QED," *Physica Scripta*, vol. T137, 014004, 13 pages (2009).
(Continued)

*Primary Examiner* — Jeff Natalini
(74) *Attorney, Agent, or Firm* — Fitzpatrick, Cella, Harper & Scinto

(57) ABSTRACT

The present invention introduces a detector that is able to detect single microwave photons propagating in a waveguide. The waveguide of the invention is lowered to a temperature where it becomes superconductive. Disposed between a middle wire and a ground plane of the waveguide is a very small piece of a desired normal metal, whereby so-called SN contacts are formed between these materials. A separate reflection measurement circuit is coupled to the normal metal piece. When the impedance of the waveguide is matched to the impedance of the normal metal piece as well as possible, a photon propagating in the waveguide is most likely absorbed in the normal metal. The absorption slightly raises the temperature of the piece, which further changes the impedance observed in a so-called SIN junction between the reflection measurement circuit and the piece. The changed amplitude and phase are detectable at the outlet obtained from a mixer of the reflection measurement circuit, whereby a single absorbed photon can be detected. In principle, the present method and device enable quantum calculation in view of future applications.

26 Claims, 2 Drawing Sheets

Figure 1:
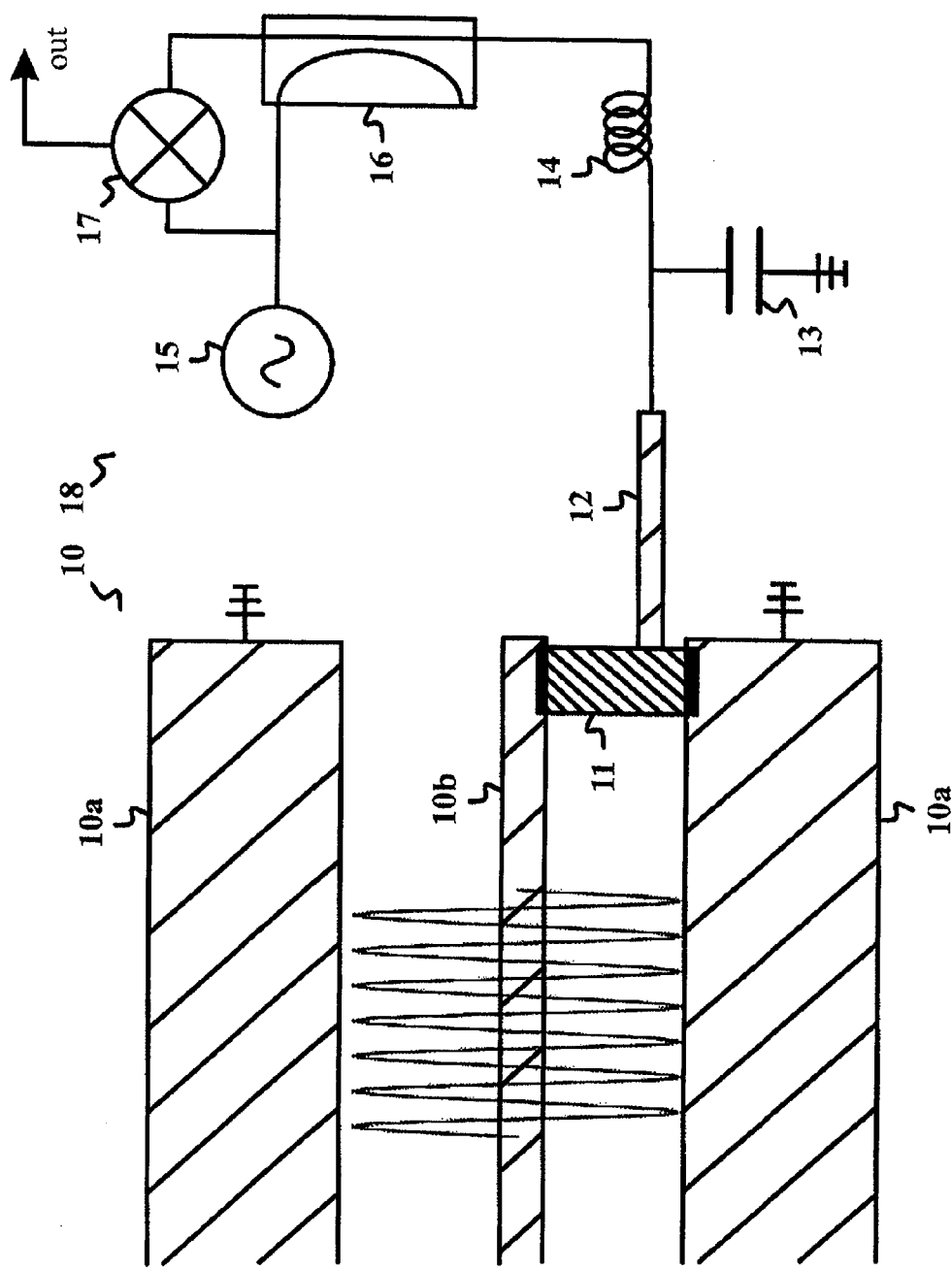

(51) Int. Cl.
  *G01J 1/42* (2006.01)
  *G06N 99/00* (2010.01)
  *H01L 39/22* (2006.01)
  *G01J 5/20* (2006.01)
  *B82Y 15/00* (2011.01)

(56) References Cited

U.S. PATENT DOCUMENTS

| | | | | |
|---|---|---|---|---|
| 5,220,328 | A | * | 6/1993 | Jehle et al. .................... 342/21 |
| 5,543,386 | A | | 8/1996 | Findikoglu et al. ............ 505/210 |
| 5,634,718 | A | | 6/1997 | Martinis et al. ................ 374/32 |
| 6,828,809 | B1 | * | 12/2004 | Bruce et al. ............... 324/754.23 |
| 2002/0067171 | A1 | * | 6/2002 | Lanan .................. G01R 27/04 324/642 |
| 2002/0118024 | A1 | * | 8/2002 | Hill ............................... 324/642 |
| 2004/0200950 | A1 | * | 10/2004 | Beausoleil et al. ......... 250/214.1 |
| 2008/0197285 | A1 | * | 8/2008 | Frey et al. .................. 250/336.2 |
| 2009/0084991 | A1 | * | 4/2009 | Ichimura et al. ........... 250/493.1 |
| 2009/0121952 | A1 | * | 5/2009 | Shibuya et al. .............. 343/767 |
| 2011/0253906 | A1 | | 10/2011 | Solano et al. .............. 250/473.1 |

OTHER PUBLICATIONS

M. Nahum, et al., "Ultrasensitive-hot-electron microbolometer," *Applied Physics Letters*, vol. 63, No. 22, pp. 3075-3077 (Nov. 1993).

M. Nahum, et al., "Design Analysis of a Novel Hot-Electron Microbolometer," *IEEE Transactions on Applied Superconductivity*, vol. 3, No. 1, pp. 2124-2127 (Mar. 1993).

L. Kuzmin, "Superconducting cold-electron bolometer with proximity traps," *Microelectronic Engineering*, vol. 69, pp. 309-316 (2003).

D.R. Schmidt, et al., "Nanoscale radio-frequency thermometry," *Applied Physics Letters*, vol. 83, No. 5, pp. 1002-1004 (Aug. 2003).

F. Giazotto, et al., "Opportunities for mesoscopics in thermometry and refrigeration: Physics and applications," *Reviews of Modern Physics*, vol. 78, No. 1, pp. 217-274 (Jan. 2006).

J. Aumentado, et al., "Proximity effect thermometer for local electron temperature measurements on mesoscopic samples," *Applied Physics Letters*, vol. 75, No. 22, pp. 3554-3556 (Nov. 1999).

G.S. Buller, et al., "Single-photon generation and detection," *Measurement Science and Technology*, vol. 21, pp. 1-18 (2010).

* cited by examiner

DETECTOR OF SINGLE MICROWAVE PHOTONS PROPAGATING IN A GUIDE

FIELD OF THE INVENTION

The present invention relates to the field of electrical engineering and quantum mechanics and, more precisely, to the detection of single photons in the microwave range.

BACKGROUND OF THE INVENTION

Sensitive detectors of electromagnetic radiation constitute an area that has been much studied but that encompasses many challenges. Production and detection of single photons in the microwave frequencies is a technical field that has proven to be challenging. In the prior art, sensitive detectors have been constructed for electromagnetic radiation particularly in the optical frequency range, whereby the frequency of radiation is at least tens of terahertz. Such photodetectors, i.e. sensitive detectors, of the optical range can be implemented by various techniques, such as by photodiodes or by the CCD technology, but it has been essential of the operating environment for the detectors of the optical range that the photons carrying radiation are photons propagating in a free space.

In the area of microwave radiation, publication Romero et al.: "Photodetection of propagating quantum microwaves in circuit QED, Phys. Scr. T137 014004, published on 14 Dec. 2009" has been disclosed in the prior art. Romero discloses a detector, i.e. a photodetector, operating in a metallic microwaveguide in such a way that small absorber pieces are disposed to the waveguide either as a group or at equal intervals. The principle in Romero is that, as a microwave photon hits the pieces in the waveguide and absorbs therein, coherent excitations occur, causing changes in the absorber states. Romero specifically detects these changes of state. The greatest problem in Romero is that it requires a large number of absorbers that must be accurately measured one by one. The detector therefore becomes large and complicated to use. In addition, the photons can scatter from the absorbers without being absorbed which increases the detector error.

In general, the main problem of the prior art is that, in entering the microwave range, i.e. in calculating the frequency from the order of terahertz up to 10 GHz, it has not been possible to produce an accurate photon detector that would accurately detect even single photons and thereby enable quantum calculation in the microwave range. In other words, there exists a fundamental demand for an extremely sensitively operating detector of microwave photons, in view of the development of the state of the art technology, such as even a quantum computer.

OBJECTIVE OF THE INVENTION

The objective of the invention is to introduce an extremely sensitive photon detector operating in the microwave range that is able effectively to detest single microwave photons propagating in a metallic waveguide.

SUMMARY OF THE INVENTION

The present invention introduces a method for detecting single microwave photons in a metallic waveguide. To enable the method, at least one microwave photon is first created in the waveguide disposed in a superconductive state. The characteristic features of the invention include directing at least one microwave photon from the waveguide to a resistive element in a manner as free of losses as possible, and, after this, measuring the change of impedance by a reflection measurement circuit due to heating of the resistive element in a junction between the resistive element and the reflection measurement circuit.

In one embodiment of the present invention, the impedance of the waveguide is matched to the impedance of the resistive element by changing the thickness of a middle wire in the waveguide relative to the distance of the middle wire from a ground plane.

In one embodiment of the present invention, the impedance of the waveguide is matched to the impedance of the resistive element by changing the ratio between different dimensions of the resistive element without changing the volume of the element.

In one embodiment of the present invention, RF reflection measurement is used to measure the change of impedance in a superconductor-insulator-normal metal junction of the resistive element.

In one embodiment of the present invention, the resistive element being used is a normal metal piece, semiconductor nanowire, graphene piece or carbon nanotube.

In one embodiment of the present invention, magnetic impurity atoms are mixed in the resistive element in order to eliminate or modify the proximity effect of superconductivity.

In one embodiment of the present invention, an external magnetic field is created in the area of the resistive element in order to eliminate or modify the proximity effect of superconductivity.

In one embodiment of the present invention, at least one measurement head is coupled to the resistive element, independently to control the temperature of the resistive element and measure the voltage and current in the presence of bias current in at least one superconductor-insulator-normal metal junction.

In one embodiment of the present invention, the impedance of the junction between the resistive element and the reflection measurement circuit is measured at a frequency resulting in a time period between sample points that is substantially shorter than the recovery time of a temperature peak observed in the resistive element.

In one embodiment of the present invention, the change of amplitude and phase in a signal reflected in the reflection measurement circuit is measured, the change being a result of the change in a reflection coefficient of the reflection measurement circuit—resistive element—junction, which further results from the change of impedance in the junction between the resistive element and the reflection measurement circuit due to heating of the resistive element.

In one embodiment of the present invention, a single photon entering the detector is concluded based on the measured change, and quantum calculation is performed by registering the incoming single photons on a storage medium.

In one embodiment of the present invention, the frequency range used in the method is above 10 GHz in the microwave range, and the dimensions of the resistive element range between 5 nm . . . 800 nm.

In one embodiment of the present invention, free photons propagating in a vacuum or in the air are further detected in the method by an integrated antenna.

According to a second aspect of the invention, the inventive idea includes a device corresponding to the method for detecting single microwave photons in a metallic waveguide. The device comprises a metallic waveguide in a superconductive state in which at least one microwave photon is absorbed. As characteristic features, the device further comprises a resistive element to which at least one microwave photon is directed from the waveguide in a manner as free of losses as possible, and a reflection measurement circuit for measuring the change of impedance by reflection measurement in a junction between the resistive element and the reflection measurement circuit due to heating of the resistive element.

In one embodiment of the present invention, the device further comprises impedance matching means for matching the impedance of the waveguide to the impedance of the resistive element by changing the thickness of a middle wire in the waveguide relative to the distance of the middle wire from a ground plane.

In one embodiment of the present invention, the device further comprises said impedance matching means for matching the impedance of the waveguide to the impedance of the resistive element by changing the ratio between different dimensions of the resistive element without changing the volume of the element.

In one embodiment of the present invention, the device further comprises said reflection measurement circuit for conducting a RF reflection measurement by measuring the change of impedance in a superconductor-insulator-normal metal junction of the resistive element.

In one embodiment of the present invention, the device further comprises a normal metal piece, semiconductor nanowire, graphene piece or carbon nanotube as the resistive element.

In one embodiment of the present invention, the device further comprises magnetic impurity atoms mixed in the resistive element in order to eliminate or modify the proximity effect of superconductivity.

In one embodiment of the present invention, the device further comprises means for creating an external magnetic field, arranged to create a magnetic field in the area of the resistive element in order to eliminate or modify the proximity effect of superconductivity.

In one embodiment of the present invention, the device further comprises at least one measurement head coupled to the resistive element, arranged independently to control the temperature of the resistive element and measure the voltage and current in the presence of bias current in at least one superconductor-insulator-normal metal junction.

In one embodiment of the present invention, the device further comprises said reflection measurement circuit arranged to measure the impedance of the junction between the resistive element and the reflection measurement circuit at a frequency resulting in a time period between sample points that is substantially shorter than the recovery time of a temperature peak observed in the resistive element.

In one embodiment of the present invention, the device further comprises said reflection measurement circuit arranged to measure the change of amplitude and phase in a reflected signal, the change being a result of the change in a reflection coefficient of the reflection measurement circuit-resistive element interface, which further results from the change of impedance in the junction between the resistive element and the reflection measurement circuit due to heating of the resistive element.

In one embodiment of the present invention, the device further comprises a control logic for concluding the appearance of a single photon based on the measured change, wherein the control logic is further arranged to perform quantum calculation by registering the incoming single photons on a storage medium.

In one embodiment of the present invention, the device is further arranged to use a frequency range above 10 GHz in the microwave range, and the dimensions of the resistive element range between 5 nm . . . 800 nm.

In one embodiment of the present invention, the device further comprises an antenna integrated to the device, whereby the device is arranged to detect free photons propagating in a vacuum or in the air.

The distinctive advantage of the invention is that it introduces an extremely sensitive photon detector which has never been disclosed before as equipped with the indicated sensitivity. The device that is suitable for detecting single microwave photons may, at the same time, operate as an extremely sensitive spectrum analyzer in microwave frequencies above 10 GHz. The advantage of the invention encompasses the extremely good sensitivity of the detector, which is clearly better than in any corresponding detector disclosed in the prior art.

LIST OF FIGURES

Figures 2A, 2B:
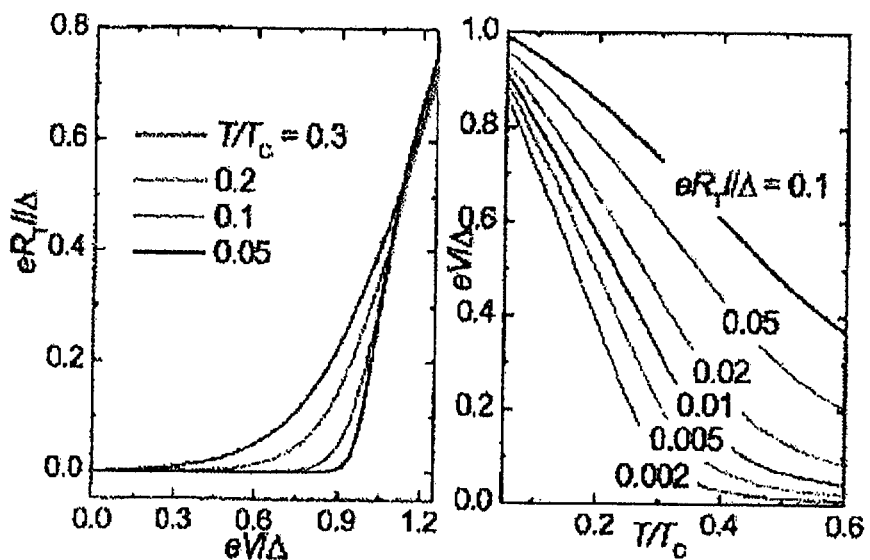
Figure 2C:
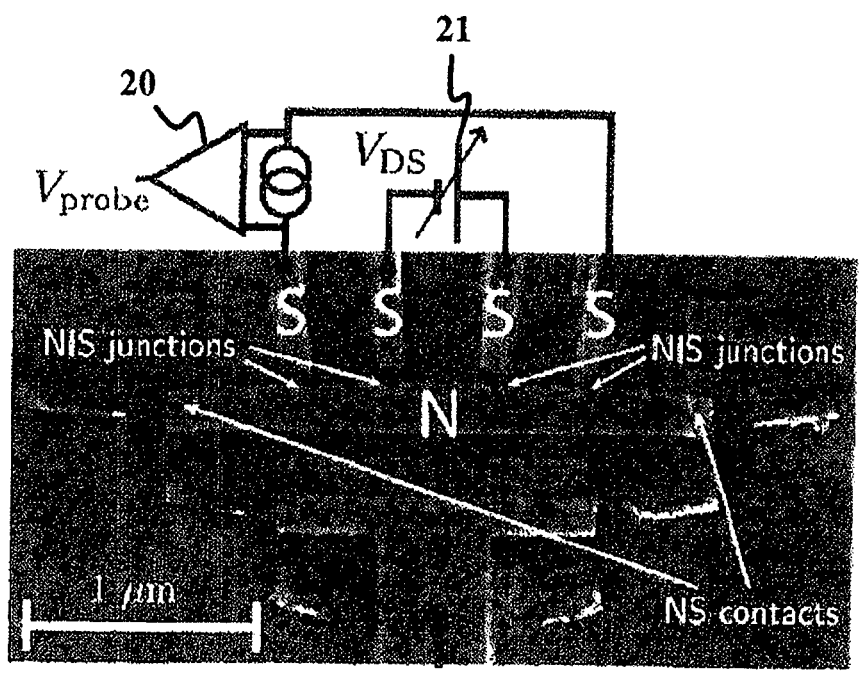

FIG. 1 illustrates the structure of a detector according to the present invention, including a waveguide, normal metal piece and reflection measurement circuit operating in the RF, FIG. 2a represents calculated electric current through a so-called SIN junction as a function of voltage at different temperatures, FIG. 2b represents the corresponding voltage as a function of temperature with different values of bias currents, and FIG. 2c illustrates an example of an arrangement of a voltage measurement in so-called SIN junctions.

DETAILED DESCRIPTION OF THE INVENTION

The present invention concerns particularly a frequency range above 10 GHz, i.e. the range of microwave frequencies. There has not been provided suitable detectors for accurate detection of single photons for this frequency range.

First, the photons must be created, which requires a suitable photon source. After this, it must be possible to manipulate the created photons so as to make them propagate in a controlled fashion in a waveguide, preferably so as to be able to know the moment of emission of a single photon from the photon source. In case the intention is to use the photons for quantum calculation, it is also important to manipulate these photons so as to be able to produce a sufficient degree of photon-photon interactions. Photon sources per se already exist, but the important feature is that photons can be generated in a controlled manner, i.e. in a way where it is known when a single photon is generated and in which direction it will propagate. For example, a superconductive cavity that is a one-dimensional cut wire or a waveguide allows one well to determine the direction of the emitted photon.

On the other hand, the movement of microwave photons can be locally directed, i.e. one bit operations can be performed for quantum calculation, also by modifying the electric or magnetic field in the known superconductive components such as SQUIDs or Cooper pair transistors. Previously, the phase displacement of optical photons has been carried out by providing a piece of material on the propagation path of the photon, which piece is then separately heated. The photon having propagated through the heated material piece is exposed to a phase displacement depending on the temperature of the piece. However, this encompasses the problem of heating always being accompanied by a delay which brings slowness to the processing of the photon, and, when the material is being heated, it also begins to absorb the photons more easily.

The present invention introduces a detector operating in the frequency range of microwaves and being suitable for accurate detection and calculation of single photons. FIG. 1 illustrates an exemplifying structural view of the detector according to the present invention. The arrangement of the invention can be carried out by a waveguide 10 operating in the microwave range, the metal parts 10a of which waveguide are superconductive when the temperature of the arrangement has been set sufficiently low. Typically, in this case, this occurs less than ten kelvins away from the absolute zero and, in this embodiment, the order of the temperature in the device ranges from a few tens of millikelvins to a few hundred millikelvins. The waveguide 10 consists of two parallel ground planes 10a having a wire 10b positioned therebetween, also referred to herein as "middle wire" due to its location between the ground planes 10a, as shown. The characteristic impedance of the waveguide 10 depends on the ratio of the width of the middle wire 10b to the distance between the middle wire 10b and the ground plane 10a.

In the present invention, a small resistive element 11 is placed to the end of such a waveguide, the element in one embodiment of the invention being a so-called normal metal piece. By normal metal is meant a metal functioning in a classical manner in terms of electrical conductivity, as distinct from a superconductor, the resistivity of which is zero. The resistive element 11, in one embodiment of the invention, is thus completely normally conductive and not at all superconductive. The material of the metal piece, i.e. the resistive element 11, per se can be selected from many different alternatives. In a preferred embodiment, the size of the resistive element 11 is as small as is possible to make in terms of the manufacturing technique (for example by lithography), typically a piece of the order of 5 . . . 30 nm*10 . . . 30 nm*100 . . . 300 nm having the shape of a cuboid. The normal metal piece 11 is disposed to the end of the waveguide between the middle wire 10b and one of the ground planes 10a, and its purpose in this connection is to operate as an absorber for microwaves. It should be noted that the structure forms junctions or interfaces between the superconductor and the normal metal.

In this case, it is preferred and actually imperative that the photon propagating along the waveguide 10 (indicated as waves in FIG. 1) can be absorbed, with as great a probability as possible, in the normal metal piece 11. This is because an incomplete absorption directly produces detector errors. From the optimal absorption it follows that the characteristic impedance of the waveguide 10 will be as closely as possible identical to the impedance of the normal metal piece 11. In this case, the general principle of impedance matching is therefore applied, according to which the energy of the photon is transferred without reflections over the interface, with as great a probability as possible, when the impedances of the elements on different sides of the interface are as closely as possible identical.

It was discovered in the present invention that, as long as the normal metal piece 11 is sufficiently small and therefore has a small heat capacity, the temperature thereof rises slightly but, on the other hand, observably even when the amount of energy of a single microwave photon is absorbed therein. It can be stated that the energy of a photon hitting the normal metal piece 11 is absorbed specifically in the electrons of the material, which leads to a microscopically small increase in their movement, which further indicates very small elevation of the temperature in the material. Theoretically, the elevation of the temperature ΔT can be expressed by the formula:

$$\Delta T = \frac{\Delta Q}{C} = \frac{hf}{C} \tag{1}$$

where $\Delta Q$ is the energy of the photon, C is the heat capacity of the absorber material, h is the Planck constant and f is the frequency of the photon.

The elevation of the temperature is visible as a peak in the temperature to be measured, which is recovered over time. When the temperature is very low, a small degree of lattice vibrations, i.e. photons, is typically present in the normal metal. This follows that the so-called electron-photon coupling is weak. This follows further that the temperature peak being the result of the photon absorbing in the normal metal is recovered relatively slowly. This provides a good opportunity to measure the temperature peak, as long as the measurement can be conducted as quickly as possible after the appearance of the temperature peak.

Next, the theoretical background of the structure measuring the temperature of the normal metal piece 11 will be discussed. One or more superconductive very small measurement heads can be coupled to the normal metal piece 11 (see also FIG. 2c which will be discussed below in more detail) and, additionally, a thin layer of an insulator is additionally disposed between the so-called SN structures being thus formed, whereby a so-called SIN or a NIS junction, i.e. a superconductor-insulator-normal metal junction, is formed over said interface. For example, aluminum oxide can be used as the insulator. The principle of this structure is that, in this connection, the tunneling effect of the electrons can be utilized between the superconductor and the normal metal. In this case, a current-voltage characteristic curve can be observed at the SIN junction. Typically, at such a junction, there is not much tunneling of a higher order, and, on this account, the current propagating over the junction consists of sequential tunneling of single electrons, being further formed by excitation of quasi-particles in the superconductor. According to the BCS theory (Bardeen-Cooper-Schrieffer), the minimum energy difference between the excited states is $2\Delta$, which is the minimum energy required to break one so-called Cooper pair. As an approximation, at a temperature T=0 K:

$$2\Delta \approx 3.5 k_B T_c \tag{2}$$

where $k_B$ is the Boltzmann constant and $T_c$ is the critical temperature of the material being examined (below which superconductivity is possible). The order of magnitude of this energy in many materials is of the order of a millesimal of an electron-volt. Heat energy thus breaks a Cooper pair very easily, and a superconductive material in this case becomes a so-called normal metal.

In the ideal situation, at a temperature T=0 K, the current does not propagate through the SIN junction when the voltage is less than $\Delta/e$. When the temperature is between $$0 \leq T << \frac{\Delta}{k_B},$$

the current propagating over the interface depends on the temperature of the normal metal.

FIG. 2a shows the behavior of the current propagating through one SIN junction (y-axis) at different temperatures as a function of input voltage (x-axis). The upmost curve represents the temperature $T=0.3*T_c$ and the lowest one represents the temperature $T=0.05*T_c$. The figure shows that the current increases when the temperature rises. If bias current is input to such a structure and the voltage is measured further, the sensitivity of such a solution functioning as a thermometer is clearly improved. The measurement results of such an arrangement supplemented with bias are, in turn, shown in FIG. 2b, where, contrary to the above-said, the x-axis represents the temperature, the y-axis represents the current and different curves represent the voltage. These figures are also presented in "F. Giazotto et al., Rev. Mod. Phys. 78, 217 (2006)" and "O.-P. Saira et al., Phys. Rev. Lett. 99, 027203 (2007)", where the inventors of the present invention are included as authors.

One example of the principle of the temperature measurement arrangement with the SN contacts and the SIN junctions is shown in FIG. 2c, wherein a normal metal piece (N) is coupled to four superconductive measurement heads (S) through which the voltage-current behavior of the normal metal piece is measured. In the arrangement of FIG. 2c, the outermost normal metal-superconductor junctions correspond to the coupling of the normal metal piece to the waveguide. The temperature of the normal metal piece is controlled through the two innermost SIN junctions as desired (using $V_{DS}$ 21), and the voltage is measured and bias current input through the two outermost SIN junctions ($V_{probe}$ 20). On the other hand, in the present invention, the arrangement can also be carried out in other manners and, for example, using only one SIN junction as presented in FIG. 1. FIG. 2c also shows the order of magnitude of the elements of this example.

As a single photon absorbs in the normal metal piece, a temporary elevation of the temperature occurs, after which the temperature decreases, yet relatively slowly, due to said "weak coupling". When using for example photons of 10 GHz and copper as the normal metal having a size of 200 nm*30 nm*20 nm, the elevation of the temperature of 11 mK can be observed from the absorption of one photon. This result is obtained by equation (1):

$$\Delta T = \frac{hf}{\gamma VT}, \tag{3}$$

where $\gamma$ is the Sommerfeld constant (this constant for copper at low temperatures is ~100 J/(m$^3$K$^2$)) and V is the volume of the normal metal piece.

This small rise of the temperature must be sufficiently accurately and quickly measurable. Examination of the above-mentioned electron-photon coupling and the thermal conductance thereof gives:

$$G_{e-p} = 5\Sigma VT^4 \tag{4}$$

where $\Sigma$ is a material-dependent parameter (for example for copper ~2*10$^9$ W/(m$^3$K$^5$)). This gives further the heat-pulse-specific damping period:

$$\tau = \frac{C_e}{G_{e-p}} = \frac{\gamma}{5\Sigma T^3} \tag{5}$$

which gives, by the above-mentioned parameters, a recovery period of ~80 μs. The data point interval of the temperature measurement can be selected to be for example 0.1 μs, corresponding to the measurement bandwidth of 10 MHz.

Another important feature in measuring the temperature change is the sensitivity of the temperature measurement circuit that must be, in the presented embodiment and with the above-said parameter examples, of the order of ~10 μK/Hz$^{1/2}$ or better (smaller). The level of noise that is always present in the measurements determines the limit of how good sensitivity can be reached at all.

In addition, in observing the temperature change, it is essential that, as the photon absorbs in the normal metal piece and as a result of the consequent heating, the resistance of the SIN junction is reduced. This effect makes it possible to provide the arrangement as if a thermometer by which the temperature can be measured even continuously and which can be used to express the moments where single photons emerge from the waveguide.

At this stage, the arrangement illustrated in FIG. 1 is discussed again. In the present invention, the above-mentioned measurement of the temperature change can be carried out by a radio-frequency reflection measurement 18 connected to a so-called tank circuit, i.e. an LC-circuit formed by a coil 14 and a capacitor 13. On the other hand, instead of the simplest tank circuit thus formed, also other types of tank circuits that are more complex can be used. In this example, reference is made particularly to the circuit depicted in the right-side half of FIG. 1. The reflection measurement circuit 18 includes a RF signal source 15, a coil 14 and a capacitor 13 storing energy, an isolator 16, a mixer 17 and a signal outlet port separating from the mixer, indicated as "out". Disposed between the normal metal piece 11 and the reflection measurement circuit 18 is superconductive metal 12, forming the above-described SIN junction to the interface of 11 and 12. The reflection measurement circuit 18 per se has been known in connection with completely different types of measurement applications but has never been used in the detection of single photons as in the present invention. Such a measurement arrangement allows one to measure the conductance of the SIN junction in the normal metal piece 11, and the measurement can be performed continuously, if desired. When the conductance of the SIN junction changes, the amplitude of the RF signal reflecting back therefrom (to right in FIG. 1) changes as well. This reflection and the change therein can be directly detected at the outlet port "out". When, for example, the above-mentioned 10 MHz is selected as the bandwidth for the measurement, sample points can be provided at such a frequency as a function of time that the peak of the temperature change caused by a single absorption will not dampen significantly before the moment of measurement.

The above-described structure of the photon detector enables effective detection of the rise of temperature caused by the absorption of a single photon, constituting a projective measurement of the quantum-mechanical state of the photon, which further is a necessary part of quantum calculation potentially performed in the microwave region in the future. The photon detector operating in the manner described above can also function as an extremely sensitive spectrum analyzer over frequencies of the microwave range above 10 GHz.

A proximity effect concerning superconductivity and the presented structure means that the resistive element itself in the illustrated solution (for example a piece of normal metal) changes in its application conditions, i.e. at a very low temperature and in contact with the superconductor, into superconductive material. The susceptibility for this is partially due to the very low volume of the material piece. The proximity effect is, for the functionality of the invention, usually harmful, and one way of preventing the development of the proximity effect is to add magnetic impurity atoms to the normal metal. Another way of preventing the proximity effect is to use coupling of a local external magnetic field to the area of the normal metal piece, whereby the normal metal does not become superconductive as easily as with a zero field. The effect of this field on the actual superconductor is minimal, because the critical field thereof is much greater than the field required to prevent superconductivity caused by the proximity effect. One possibility in controlling the proximity effect is also to use the magnetic impurity atoms in the normal metal as well as the external magnetic field simultaneously.

On the other hand, in some situations, the proximity effect of superconductivity may even be a useful phenomenon in terms of the operation of the detector of the invention. This is the case if the measurement of temperature proves to be more sensitive when the normal metal piece exhibits a little bit of superconductivity. In these circumstances, in one embodiment of the invention, the proximity effect of superconductivity may be allowed to affect the normal metal piece of the detector so as to make the normal metal piece slightly, i.e. very weakly, superconductive. In other words, in the above-mentioned manners, the proximity effect of superconductivity can be managed and controlled in such a way that, if necessary, very weak superconductivity can be generated in the normal metal piece.

In one embodiment of the invention, the normal metal piece 11 can be replaced with a carbon nanotube or a graphene solution. Another possibility is to replace the normal metal piece 11 with a semiconductor nanowire. In the nanotube and graphene solutions, it is particularly preferred that, in this case, the particular resistive element in which the photons absorb can be made even smaller than before. This further improves sensitivity of the measurement and may bring the possible frequency of single photons to be detected by the detector down by orders.

The impedance of the waveguide 10 can be matched to the impedance of the normal metal piece 11 practically in two ways. The characteristic impedance of the waveguide can be adjusted by changing the distance of the middle wire 10b in the waveguide from the ground plane 10a. On the other hand, the impedance of the normal metal piece 11 can be changed by keeping its volume unchanged but by adjusting its thickness or width and by compensating for this change respectively by changing the length of the piece. Also, the impedance of the normal metal piece 11 can be adjusted with a local external magnetic field when operating in a range where the proximity effect has not been completely lost. One example of the useful dimensions is to use a copper piece having a size of $800*30*5$ $(nm)^3$, by which approximately the standard resistance of $50\Omega$ is achieved. Another example is to use gold palladium, more specifically $Au_{0.75}Pd_{0.25}$, by which, with the dimensions of $200*30*20$ $(nm)^3$, the resistance of $50\Omega$ is achieved as well.

It is to be noted that, for the functionality of the invention, it is clearly more essential closely to match the impedances between the waveguide 10 and the resistive element 11 than to provide exact absolute measures for the dimensions of the resistive element 11 or the waveguide 10.

In one embodiment of the invention, the detector can also be used to detect free photons propagating in a vacuum or in the air, if an antenna is integrated thereto.

In one embodiment of the invention, the steps of the required measurements are arranged to be executed, as applicable, by a computer program. The computer program includes program code that can be run, and is stored on a control logic readable medium. This storage medium can also be used to store the input parameters required for the invention and/or the results produced by the invention.

The invention is not limited merely to the exemplifying embodiments referred to above; instead, many variations are possible within the scope of the inventive idea defined by the claims.

The invention claimed is:

1. A method for detecting single microwave photons in a metallic waveguide, the method comprising:
    propagating at least one microwave photon in the waveguide disposed in a superconductive state;
    directing the at least one microwave photon from the waveguide to a non-superconductive resistive element in a manner as free of losses as possible, the resistive element being in contact with the waveguide; and
    measuring, by a reflection measurement circuit, a change of impedance in a junction between the resistive element and the reflection measurement circuit due to heating of the resistive element.

2. The method according to claim 1, further comprising:
    matching an impedance of the waveguide to an impedance of the resistive element by changing a thickness of a wire in the waveguide relative to a distance of the wire from a ground plane of two parallel ground planes of the waveguide, the wire being located between the two parallel ground planes.

3. The method according to the claim 1, further comprising:
    matching an impedance of the waveguide to an impedance of the resistive element by changing a ratio between different dimensions of the resistive element without changing a volume of the resistive element.

4. The method according to claim 1, wherein the measuring of the change of impedance includes measuring a change of impedance in a junction between a superconductor-insulator-normal metal element and the resistive element by a RF reflection measurement.

5. The method according to claim 4, further comprising:
    measuring a change of amplitude and phase of a reflected signal in the reflection measurement circuit, the change of amplitude and phase being a result of a change in a reflection coefficient of an interface between the reflection measurement circuit and the resistive element, and being a result of the change of impedance in the junction between the resistive element and the reflection measurement circuit due to heating of the resistive element.

6. The method according to claim 1, wherein the resistive element is formed of one of: a normal metal piece, a semiconductor nanowire, a graphene piece, and a carbon nanotube.

7. The method according to claim 1, wherein the resistive element includes magnetic impurity atoms mixed therein, in order to eliminate or modify a proximity effect associated with superconductivity.

8. The method according to claim 1, further comprising:
    applying an external magnetic field in an area of the resistive element in order to eliminate or modify a proximity effect associated with superconductivity.

9. The method according to claim 1, further comprising:
    coupling at least one measurement head to the resistive element, independently, to control a temperature of the resistive element and to measure a voltage when a bias current is present in at least one superconductor-insulator-normal metal junction.

10. The method according to claim 1, wherein, in the measuring of the change of impedance, the impedance of the junction between the resistive element and the reflection measurement circuit is measured at a frequency resulting in a time period between sample points that is substantially shorter than a recovery time of a temperature peak observed in the resistive element.

11. The method according to claim 1, further comprising:
concluding that a single photon has been detected, based on a measured change; and
performing quantum calculation by registering incoming single photons on a storage medium.

12. The method according to claim 1,
wherein the method is performed in a microwave frequency range above 10 GHz, and
wherein dimensions of the resistive element range between 5 nm and 800 nm.

13. The method according to claim 1, further comprising:
detecting free photons propagating in a vacuum or in air by using an integrated antenna.

14. A device for detecting single microwave photons in a metallic waveguide, the device comprising:
a metallic waveguide formed of a superconductive material, the waveguide being structured to propagate at least one microwave photon therein while in a superconductive state;
a resistive element formed of a non-superconductive material, the resistive element being structured to receive the at least one microwave photon from the waveguide in a manner as free of losses as possible, and the resistive element being in contact with the waveguide; and
a reflection measurement circuit structured to perform a reflection measurement to measure a change of impedance in a junction between the resistive element and the reflection measurement circuit due to heating of the resistive element.

15. The device according to claim 14, further comprising:
an impedance matcher structured to match an impedance of the waveguide to an impedance of the resistive element by changing a thickness of a wire in the waveguide relative to a distance of the wire from a ground plane of two parallel ground planes of the waveguide, the wire being located between the two parallel ground planes.

16. The device according to claim 14, further comprising:
an impedance matcher structured to match an impedance of the waveguide to an impedance of the resistive element by changing a ratio between different dimensions of the resistive element without changing a volume of the resistive element.

17. The device according to claim 14, wherein the reflection measurement circuit is structured to perform a RF reflection measurement by measuring a change of impedance in a junction between a superconductor-insulator-normal metal junction and the resistive element.

18. The device according to claim 17, wherein the reflection measurement circuit is arranged to measure a change of amplitude and phase in a reflected signal, the change of amplitude and phase being a result of a change in a reflection coefficient of an interface between the reflection measurement circuit and the resistive element and the change of impedance in the junction between the resistive element and the reflection measurement circuit due to heating of the resistive element.

19. The device according to claim 14, wherein the resistive element is formed of one of: a normal metal piece, a semiconductor nanowire, a graphene piece, and a carbon nanotube.

20. The device according to claim 14, wherein the resistive element includes magnetic impurity atoms mixed therein in order to eliminate or modify a proximity effect associated with superconductivity.

21. The device according to claim 14, further a magnetic device structured to apply an external magnetic field in an area of the resistive element in order to eliminate or modify a proximity effect associated with superconductivity.

22. The device according to claim 14, further comprising:
at least one measurement head coupled to the resistive element, independently, the at least one measurement head being arranged to control a temperature of the resistive element and to measure a voltage when a bias current is present in at least one superconductor-insulator-normal metal junction.

23. The device according to claim 14, wherein the reflection measurement circuit is arranged to measure the change of impedance in the junction between the resistive element and the reflection measurement circuit at a frequency resulting in a time period between sample points that is substantially shorter than a recovery time of a temperature peak observed in the resistive element.

24. The device according to claim 14,
a control device having logic for concluding that a single photon has been detected based on a measured change, wherein the logic of the control device is configured to perform a quantum calculation by registering incoming single photons on a storage medium.

25. The device according to claim 14,
wherein the device operates in a microwave frequency range above 10 GHz, and
wherein the resistive element has dimensions in a range between 5 nm and 800 nm.

26. The device according to claim 14, further comprising:
an antenna arranged to detect free photons propagating in a vacuum or in air.

* * * * *